(12) United States Patent
Matsumura

(10) Patent No.: US 6,511,878 B1
(45) Date of Patent: Jan. 28, 2003

(54) MANUFACTURING METHOD FOR SEMICONDUCTOR DEVICE WITH A LARGER CONTACT HOLE OPENING

(75) Inventor: Akira Matsumura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/212,259

(22) Filed: Aug. 6, 2002

(30) Foreign Application Priority Data

Feb. 8, 2002 (JP) ........................................ 2002-032504

(51) Int. Cl.$^7$ .......................................... H01L 21/8242
(52) U.S. Cl. ........................................ 438/241; 438/253
(58) Field of Search ................................ 438/210, 241, 438/253, 254, 255, 396, 397, 398, 634

(56) References Cited

U.S. PATENT DOCUMENTS 5,612,241 A * 3/1997 Arima ........................ 438/241
6,329,683 B2 * 12/2001 Kohyama ................... 438/253
6,383,868 B1 * 5/2002 Parekh et al. ............... 438/253
2002/0024085 A1 * 2/2002 Nakamura et al. .......... 438/241

FOREIGN PATENT DOCUMENTS

JP 7-45718 2/1995
JP 2001-102541 4/2001

* cited by examiner

*Primary Examiner*—Chandra Chaudhari
(74) *Attorney, Agent, or Firm*—McDermott, Will & Emery

(57) ABSTRACT

According to a manufacturing method for this semiconductor device, an etching process is carried out through wet etching so that a storage node interlayer insulating film has an etching rate with respect to an etchant for wet etching greater than that of a second interlayer insulating film and an opening first contact hole provided on storage node interlayer insulating film becomes greater than that of a first contact hole provided on second interlayer insulating film. By adopting this method, it becomes possible to obtain a semiconductor device capable of increasing a capacitance of a capacitor while an easy process can be adopted.

3 Claims, 7 Drawing Sheets

MANUFACTURING METHOD FOR SEMICONDUCTOR DEVICE WITH A LARGER CONTACT HOLE OPENING

BACKGROUND OF THE INVENTION

1. Field of the Invention

The present invention relates to a semiconductor device and a manufacturing method therefor, more particular to a semiconductor device and a manufacturing method therefor concerning increase in a capacitance of a capacitor.

2. Description of the Background Art

A three dimensional structure has come to be adopted for DRAM (dynamic random access memory) capacitors in order to secure the necessary capacitance in accordance with the scaling down of the design rule. Here, in reference to FIG. 13, a cross sectional structure of a cylindrical capacitor having a three dimensional structure adopted in a DRAM according to a prior art will be described. A bit line 102 and a storage node contact 103 are embedded into an interlayer insulating film 101.

A storage node interlayer insulating film 104 made of TEOS (Tetra Etyle Ortho Silicate) or the like is formed on interlayer insulating film 101, and a contact hole 104b which reaches to storage node contact 103 is provided on a predetermined region of this storage node interlayer insulating film 104.

A storage node (lower electrode) 108 made of a polysilicon, or the like, of which the surface has a rough state, is provided on the inner side wall of this contact hole 104b so as to form a cylinder type, and storage node contact 103 and storage node 108 are electrically connected in a bottom surface of contact hole 104b. In addition, a cell plate (upper electrode) 111 made of TiN or the like is embedded into the contact hole so as to cover the surface of storage node 108 with a dielectric film (not shown) interposed. The above described storage node 108, the dielectric film and cell plate 111 form a stacked-type cylindrical capacitor (concave type) of a DRAM.

An interlayer insulating film 112 is provided so as to cover cell plate 111 and storage node interlayer insulating film 104, and an aluminum wire 116 provided on the top surface of this interlayer insulating film 112 and cell plate 111 are electrically connected through a contact plug 114 which is embedded into a contact hole 112a provided on interlayer insulating film 112.

In addition, bit line 102 provided on another region is electrically connected to aluminum wire 116 through a contact plug 115 which is embedded into a contact hole 104a penetrating interlayer insulating film 101, storage node interlayer insulating film 104 and interlayer insulating film 112.

Here, in the case that the above described stacked-type cylindrical capacitor according to the prior art is taken into consideration, the process aspect ratio of the storage node (SN) for charge storage becomes extreme. On the other hand, at the time of dry etching of the storage node (SN), a protrusion of a tapered shape is formed at the bottom of the cylinder and; therefore, there is a problem that a sufficient opening diameter cannot be obtained at the bottom of the cylinder and the capacitance of the capacitor cannot be sufficiently secured.

In addition, in the case that the height of the cylinder is increased in order in order to secure the capacitance of the capacitor, not only the aspect ratio of the SN process but also the aspect ratio to contact hole opening for a wire provided in a subsequent step become too large and, therefore, become a factor that lowers the process yield.

SUMMARY OF THE INVENTION

An object of the present invention is to solve the above described problems and to provide a semiconductor device and a manufacturing method therefor wherein an easy process can be adopted and the increase in the capacitance of the capacitor is made possible.

In a manufacturing method for a semiconductor device according to the present invention, a manufacturing method for a semiconductor device having a memory cell region and a peripheral region, wherein the memory cell region includes a lower electrode electrically connected to a predetermined first connection region and an upper electrode provided to the lower electrode with a dielectric film interposed, includes the steps of: forming a first interlayer insulating film on the first connection region; forming a second interlayer insulating film, of which a wet etching ratio with respect to a predetermined wet etchant is greater than that of the first interlayer insulating film, on the first interlayer insulating film (4); forming a first contact hole which penetrates the first interlayer insulating film and the second interlayer insulating film to reach up to the first connection region in the memory cell region, and which is provided in a connection region between the first interlayer insulating film and the second interlayer insulating film such that an inner diameter of the first interlayer insulating film becomes greater than that of the second interlayer insulating film; forming the lower electrode in a cylindrical form along an inner surface of the first contact hole; removing only the second interlayer insulating film in the memory cell region; and interposing the dielectric film with respect to the lower electrode to embed the dielectric film into an inner peripheral surface of the lower electrode, and forming the upper electrode so as to surround an outer peripheral surface of the lower electrode.

By adopting this manufacturing method, it is made possible to form the large inner diameter of the first contact hole formed on the first interlayer insulating film which is positioned in a lower layer utilizing a wet etching ratio of a wet etchant. As a result of this, it is made possible to avoid the difficulty of forming contact hole, due to a large aspect ratio, at the time of forming contact hole in conventional dry etching.

In addition, in the lower edge portion region of the first contact hole, it is made possible to increase the capacitance of the capacitor formed of a lower electrode, a dielectric film and an upper electrode in this region and it becomes possible to increase the refresh characteristics of a DRAM in which this capacitor is applied.

Furthermore, since the wet etching ratios of wet etchants for the first interlayer insulating film and for the second interlayer insulating film are positively made different, the formation of a cylindrical-type capacitor that utilizes the outer peripheral surface region in the cylindrical portion of the lower electrode becomes possible by adopting the step wherein the second interlayer insulating film alone can be easily removed and, in addition, it becomes possible to increase the capacitance of the capacitor.

In addition, the above described manufacturing method for the semiconductor device preferably includes the steps of: forming a third interlayer insulating film which covers the upper electrode and the second interlayer insulating film; forming a second connection region in advance in a position lower than the first interlayer insulating film in the peripheral region; forming a contact hole which reaches up to the second connection region after the formation of the first interlayer insulating film, and forming a first contact plug within this contact hole; and creating a contact hole which reaches up to the first contact plug and which penetrates the second interlayer insulating film and the third interlayer insulating film after the formation of the third interlayer insulating film, and forming a second contact plug within this contact hole.

By adopting this manufacturing method, the steps are adopted wherein the first contact plug is formed before formation of the second interlayer insulating film and the second contact plug is formed after the formation of the second interlayer insulating film and, therefore, formation according to a low aspect ratio becomes possible in the formation of the first contact plug and in the formation of the second contact plug.

In addition, the above described manufacturing method for a semiconductor device preferably includes a step of forming an etching stopper film between the first interlayer insulating film and the second interlayer insulating film.

By adopting this manufacturing method, the etching rate difference in wet etching in the border between the first interlayer insulating film and the second interlayer insulating film becomes clearer and, therefore, control for removing the second interlayer insulating film alone through etching is made easier.

Next, in a semiconductor device according to the present invention, a semiconductor device having a memory cell region and a peripheral region, wherein the memory cell region includes a lower electrode electrically connected to a predetermined first connection region and an upper electrode provided to the lower electrode with a dielectric film interposed, includes: a first interlayer insulating film provided on the first connection region in the memory cell region; a second interlayer insulating film provided on the first interlayer insulating film in the peripheral region; a first contact hole which reaches up to the first connection region and which penetrates the first interlayer insulating film; the lower electrode provided in a cylindrical form so as to extend along an inner surface of the first contact hole and to upwardly protrude from an upper surface of the first interlayer insulating film; and the upper electrode which interposes the dielectric film with respect to the lower electrode to embed the dielectric film into an inner peripheral surface of the lower electrode and which is provided so as to surround an outer peripheral surface of the lower electrode, wherein an outer diameter of the lower electrode positioned within the first interlayer insulating film is provided so as to become greater than that of the lower electrode coming into contact with the upper electrode in a boundary region between the first interlayer insulating film and the upper electrode.

By adopting this structure, the inner diameter of the first contact hole is made large in a region of the first interlayer insulating film of this first contact hole and, therefore, it becomes possible to increase the capacitance of the capacitor formed of a lower electrode, a dielectric film and an upper electrode in this region. As a result of this, it becomes possible to increase the refresh characteristics of a DRAM in which such a capacitor is applied.

In addition, a cylindrical-type capacitor which utilizes the outer peripheral surface region of a cylindrical portion of a lower electrode is implemented and, thereby, it becomes possible to further increase the capacitance of the capacitor.

In addition, the above described semiconductor device preferably includes: a third interlayer insulating film which covers the upper electrode and the second interlayer insulating film; a second connection region in a position lower than the first interlayer insulating film of the peripheral region; and a second contact hole which reaches to the second connection region and which penetrates the first interlayer insulating film, the second interlayer insulating film and the third connection region, wherein a first contact plug is provided in a region positioned in the first interlayer insulating film of the second contact hole and a second contact plug is provided in a region positioned in the second interlayer insulating film and in the third interlayer insulating film of the second contact hole, wherein the second contact hole is provided so that the inner diameter in the first interlayer insulating film is greater than the inner diameter in the second interlayer insulating film in a connection region between the first interlayer insulating film and the second interlayer insulating film.

By adopting this structure, it becomes possible to form a contact, without fail, between a wire contact a peripheral region and the second connection region that is located in the lower layer.

In addition, in the above described semiconductor device, an etching stopper film is preferably further provided between the first interlayer insulating film and the second interlayer insulating film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
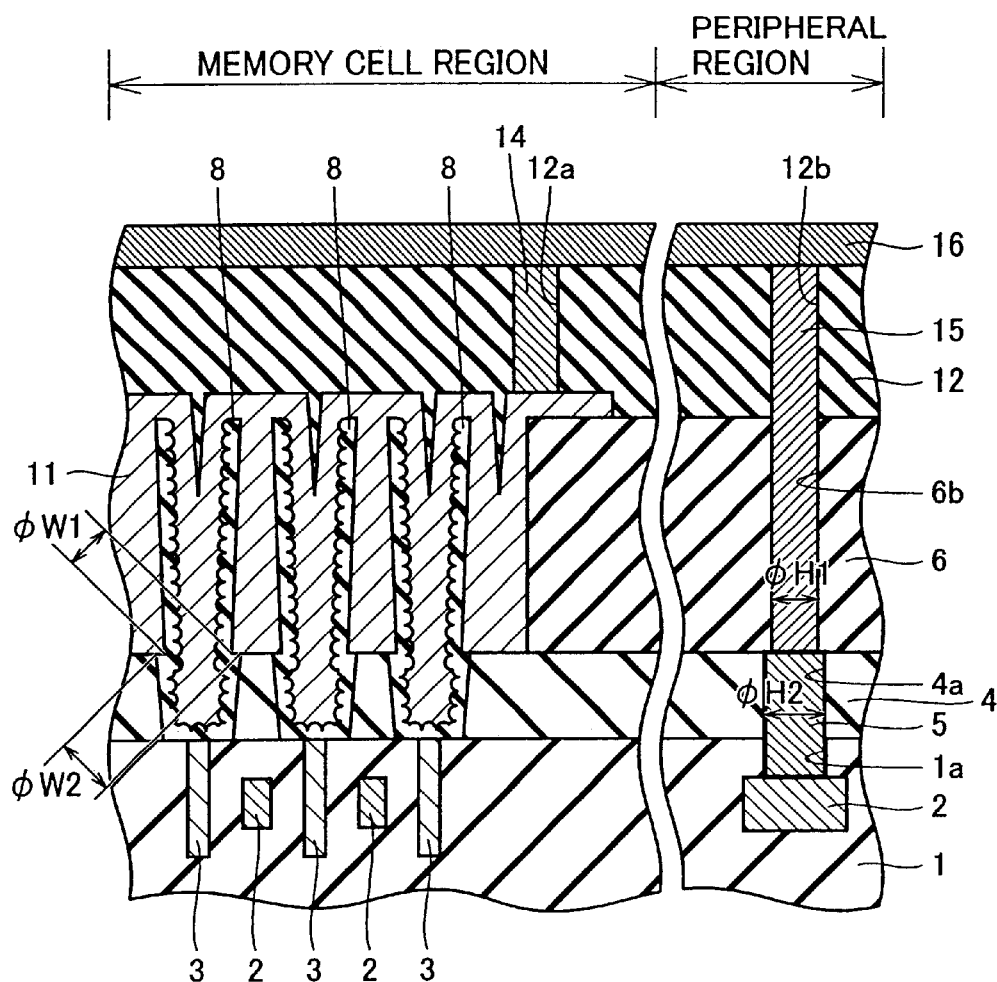
FIG. 1 is a cross sectional view showing the structure of a semiconductor device according to the first embodiment of the present invention.

In the following, the respective embodiments of the present invention and the manufacturing methods therefor will be described in reference to the drawings.
(First Embodiment)
In reference to FIGS. 1 to 9, a structure of and a manufacturing method for a semiconductor device according to the present embodiment will be described.
(Structure of Semiconductor Device)
First, in reference to FIG. 1, the structure of the semiconductor device according to the present embodiment will be described. A memory cell region and a peripheral region are provided and in the memory cell region a bit line 2 as a first contact region that forms a DRAM and a storage node. contact 3 are embedded into an interlayer insulating film 1.

In the memory cell region, a storage node interlayer insulating film 4 as a first interlayer insulating film, made of TEOS or the like, is provided on interlayer insulating film 1 and a first contact hole 4b which reaches to storage node contact 3 is provided in a predetermined region of this storage node interlayer insulating film 4.

A storage node 8 made of a polysilicon of which the inner surface is in a rough state is provided on the inner sidewalls of this contact hole 4b so as to form a cylinder and storage node contact 3 and storage node 8 are electrically connected at the bottom portion of contact hole 4b. In addition, this storage node 8 is provided so as to protrude upwardly from the upper surface of storage node interlayer insulating film 4 as shown in the figure.

A cell plate 11 made of TiN, or the like, is buried so as to cover the inner peripheral surface and outer peripheral surface of storage node 8 via a dielectric film (not shown). The above described storage node 8, dielectric film and cell plate 11 form a stacked-type cylindrical capacitor of a DRAM.

Here, the capacitor is provided so that the outer diameter ($\phi$W2) of storage node 8 positioned within storage node interlayer insulating film 4 becomes greater than the outer diameter ($\phi$W1) of storage node 8 that contacts cell plate 11 in the border region between storage node interlayer insulating film 4 and cell plate 11.

A third interlayer insulating film 12 is formed above cell plate 11 so as to cover this cell plate 11, which is electrically connected to an aluminum wire 16 provided in third interlayer insulating film 12 via a contact plug 14 embedded into contact hole 12a which penetrates this third interlayer insulating film 12.

On the other hand, bit line 2 as a second connection region is provided in interlayer insulating film 1 in the peripheral region. In addition, storage node interlayer insulating film 4, a second interlayer insulating film 6 and third interlayer insulating film 12 are provided above this interlayer insulating film 1.

In addition, a second contact hole which reaches up to bit line 2 and which penetrates storage node interlayer insulating film 4, second interlayer insulating film 6 and a third connection region 12 is provided in storage node interlayer insulating film 4, second interlayer insulating film 6 and third connection region 12. A first contact plug 5 is provided in regions 1a and 4a positioned in interlayer insulating film 1 and in storage node interlayer insulating film 4 within this second contact hole while a second contact plug 15 is provided in regions 6a and 12a positioned in second interlayer insulating film 6 and in third interlayer insulating film 12 within the second contact hole.

Furthermore, the second contact hole is provided so that the inner diameter ($\phi$H2) of storage node interlayer insulating film 4 becomes greater than the inner diameter ($\phi$H1) of the second interlayer insulating film 6 in the connection region between storage node interlayer insulating film 4 and second interlayer insulating film 6. As a result, the contact plugs are formed so that the outer diameter ($\phi$H2) of first contact plug 5 becomes greater than the outer diameter ($\phi$H1) of second contact plug 15.

In addition, aluminum wire 16, to which second contact plug 15 is electrically connected, is provided on third interlayer insulating film 12.

(Manufacturing Method for Semiconductor Device)

Next, a manufacturing method for a semiconductor device having the above described structure will be described in reference to FIGS. 2 to 9.

Figure 2:
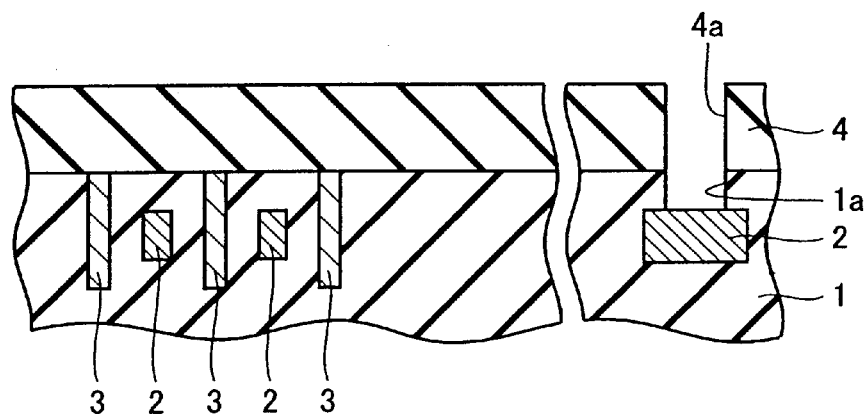
FIGS. 2 to 9 are cross sectional views of the first to eighth steps showing a manufacturing method for the semiconductor device according to the first embodiment of the present invention.

First, in reference to FIG. 2, bit line 2 and storage node contact 3 are buried in predetermined positions of the memory cell region and a BPTEOS film of which the film thickness is approximately 500 nm to 700 nm is made to grow, as storage node interlayer insulating film 4, on the surface of interlayer insulating film 1 wherein bit line 2 is buried in a predetermined position of the peripheral region. After that, an opening 4a for the creation of a second contact hole is provided above bit line 2 in storage node interlayer insulating film 4. The width of the opening ($\phi$H2) is approximately 0.3 $\mu$m to 0.4 $\mu$m.

Figure 3:
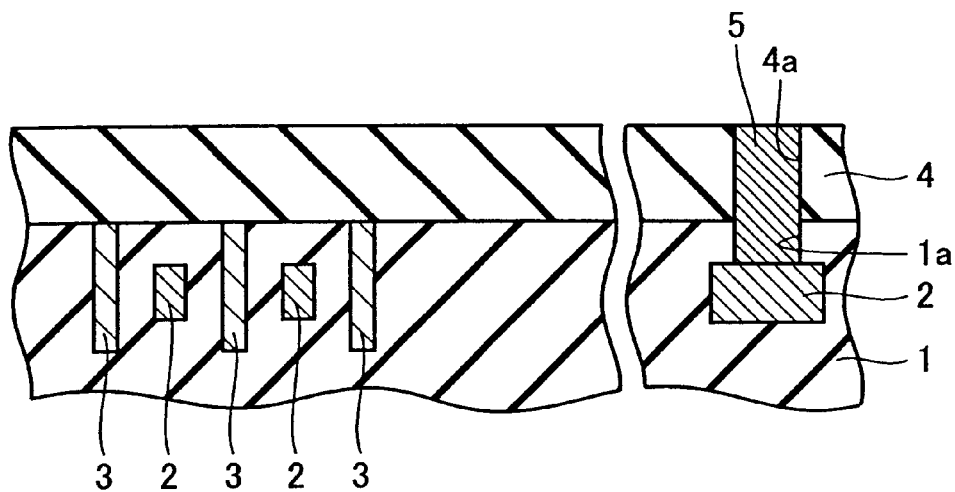

Next, in reference to FIG. 3, after the deposition of TiN/Ti, tungsten (W) is deposited through a CVD method within opening 4a and the surface is flattened through a CMP process so as to form first contact plug 5.

Figure 4:
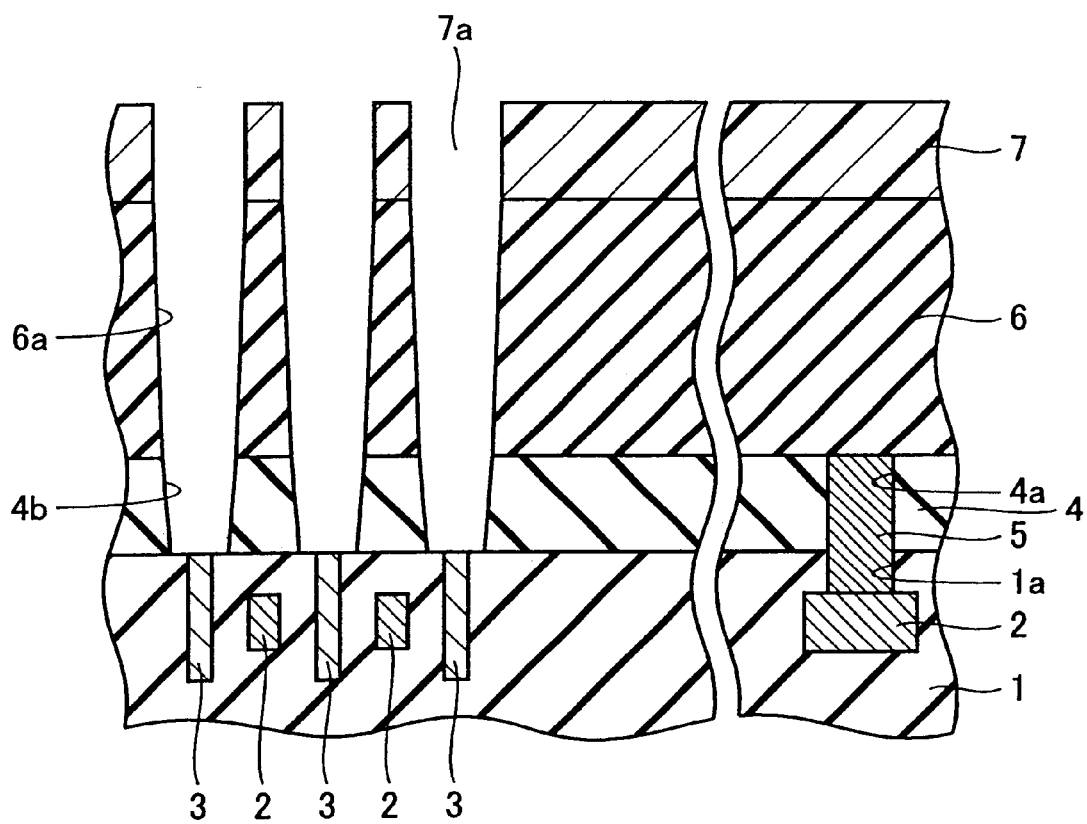

Next, in reference to FIG. 4, a TEOS oxide film of which the film thickness approximately 1000 nm to 1200 nm is made to grow, as second interlayer insulating film 6, on storage node interlayer insulating film 4. After that, a resist film 7 having a predetermined opening pattern is formed on second interlayer insulating film 6 and first contact hole 4b, 6a which reaches up to storage node contact 3 is created through dry etching. At this time, C5F8 or the like is used as the etchant.

Figure 5:
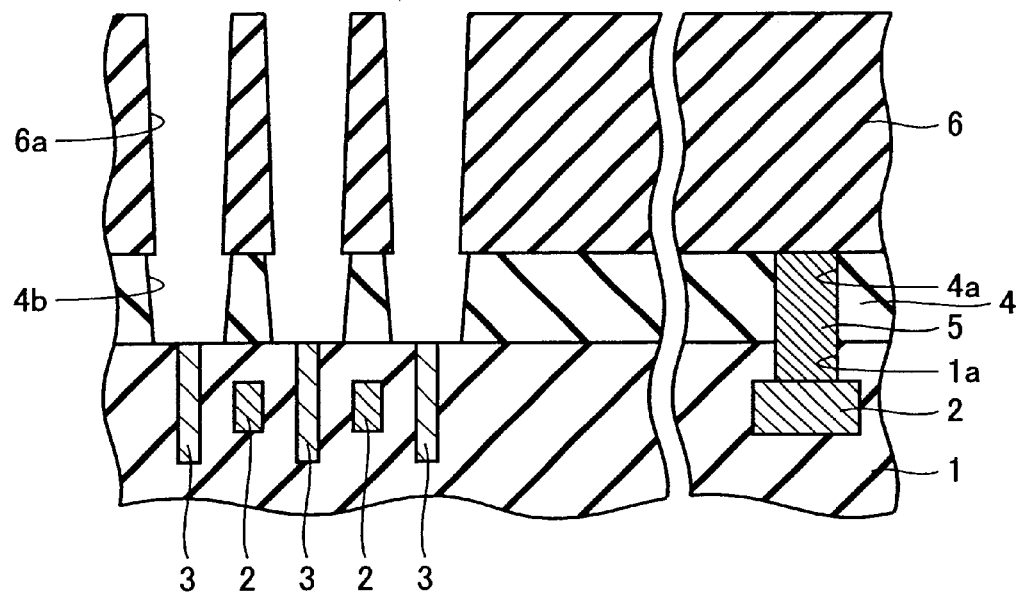

Next, in reference to FIG. 5, after the removal of resist film 7, an etching process is carried out through wet etching so that the opening of first contact hole 4b provided in storage node interlayer insulating film 4 becomes greater than the opening of first contact hole 6a provided in the second interlayer insulating film. At this time, BHF (buffered fluoric acid), or the like, is used as the etchant and, in this case, the etching rate of storage node interlayer insulating film 4 to the second interlayer insulating film is 2:1. As a result, first contact hole 4b is etched to a greater degree. In addition, the width ($\phi$W2) of the opening on the first contact hole 4b side is approximately 0.2 $\mu$m while the width ($\phi$W1) of the opening on the second interlayer insulating film side is approximately 0.15 $\mu$m.

Figure 6:
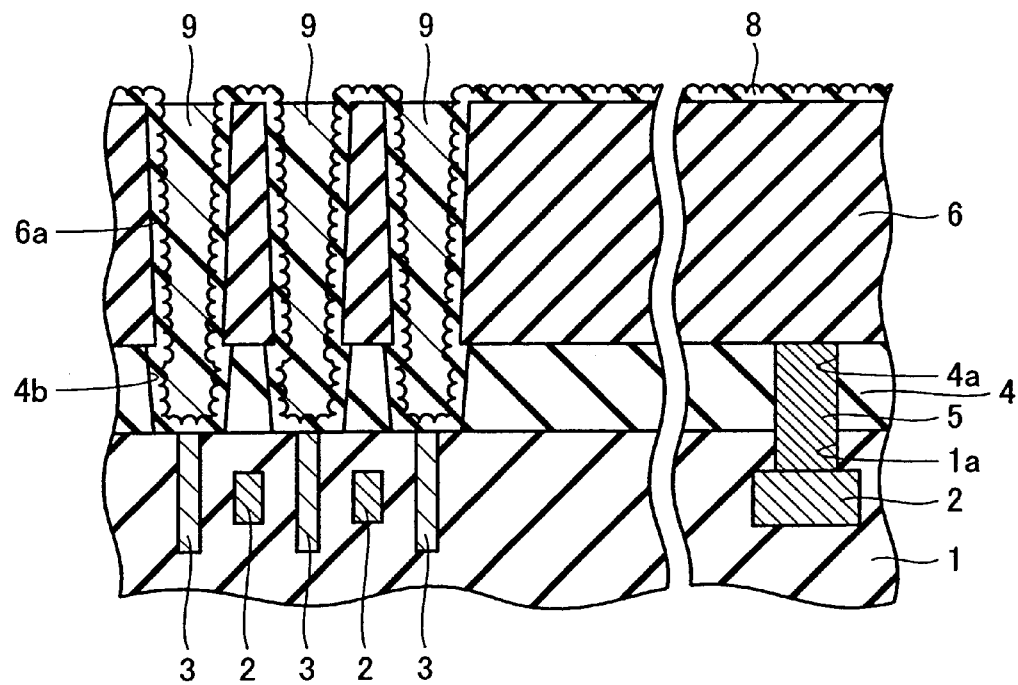

Next, in reference to FIG. 6, polysilicon 8 into which an impurity is doped is deposited to a film thickness of approximately 30 nm to 40 nm so as to cover the inner surface of first contact hole 4b, 6a and the surface of second interlayer insulating film 6 and, after that, roughening process is carried out in the surface. After that, a resist film 9 is formed only on the inner surface of first contact hole 4b, 6a.

Figure 7:
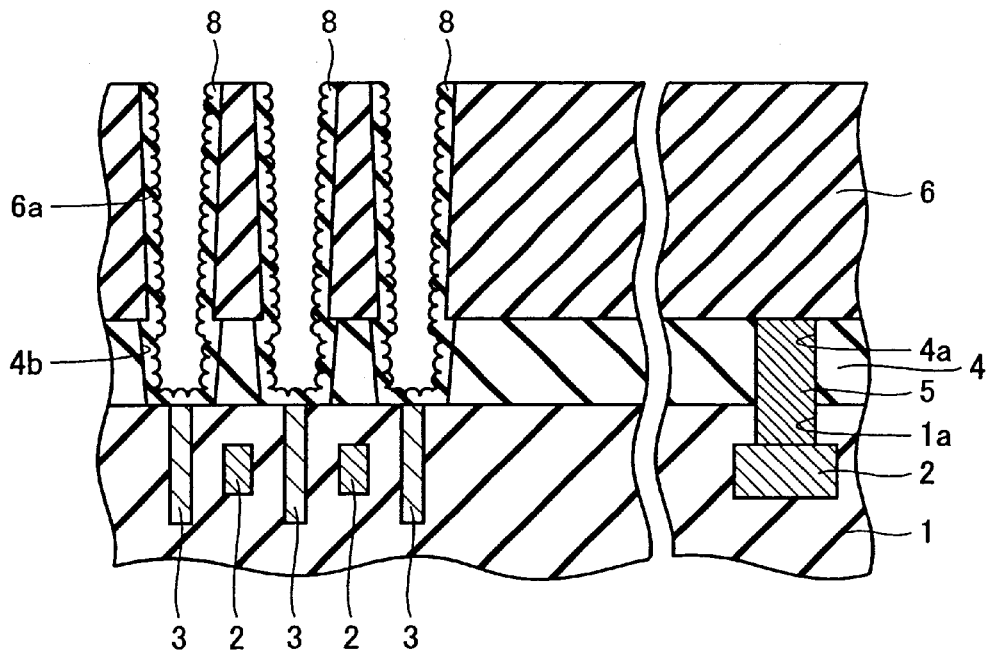

Next, in reference to FIG. 7, polysilicon 8 which covers the surface of second interlayer insulating film 6 is solely removed by means of an etch back method and, after that resist film 9 within first contact hole 4b, 6a is removed. Thereby, storage node 8 is completed.

Figure 8:
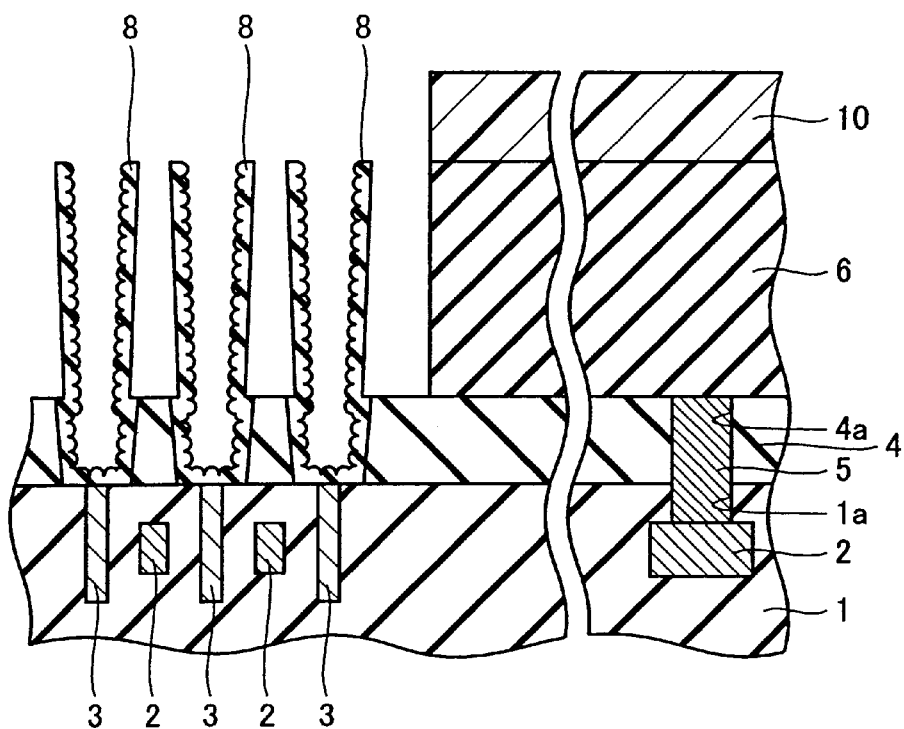

Next, in reference to FIG. 8, a resist film 10 is formed on second interlayer insulating film 6 so as to solely expose the memory cell region and second interlayer insulating film 6 is solely removed from the memory cell region, by using this resist film 10 as a mask, so that the surface of storage node interlayer insulating film 4 is exposed. A wet etching method is used for the removal of second interlayer insulating film 6 and BHF or the like is used as the etchant. Thereby, as shown in the figure, a condition is achieved wherein the cylindrical portion of storage node 8 sticks out from the surface of storage node interlayer insulating film 4.

Figure 9:
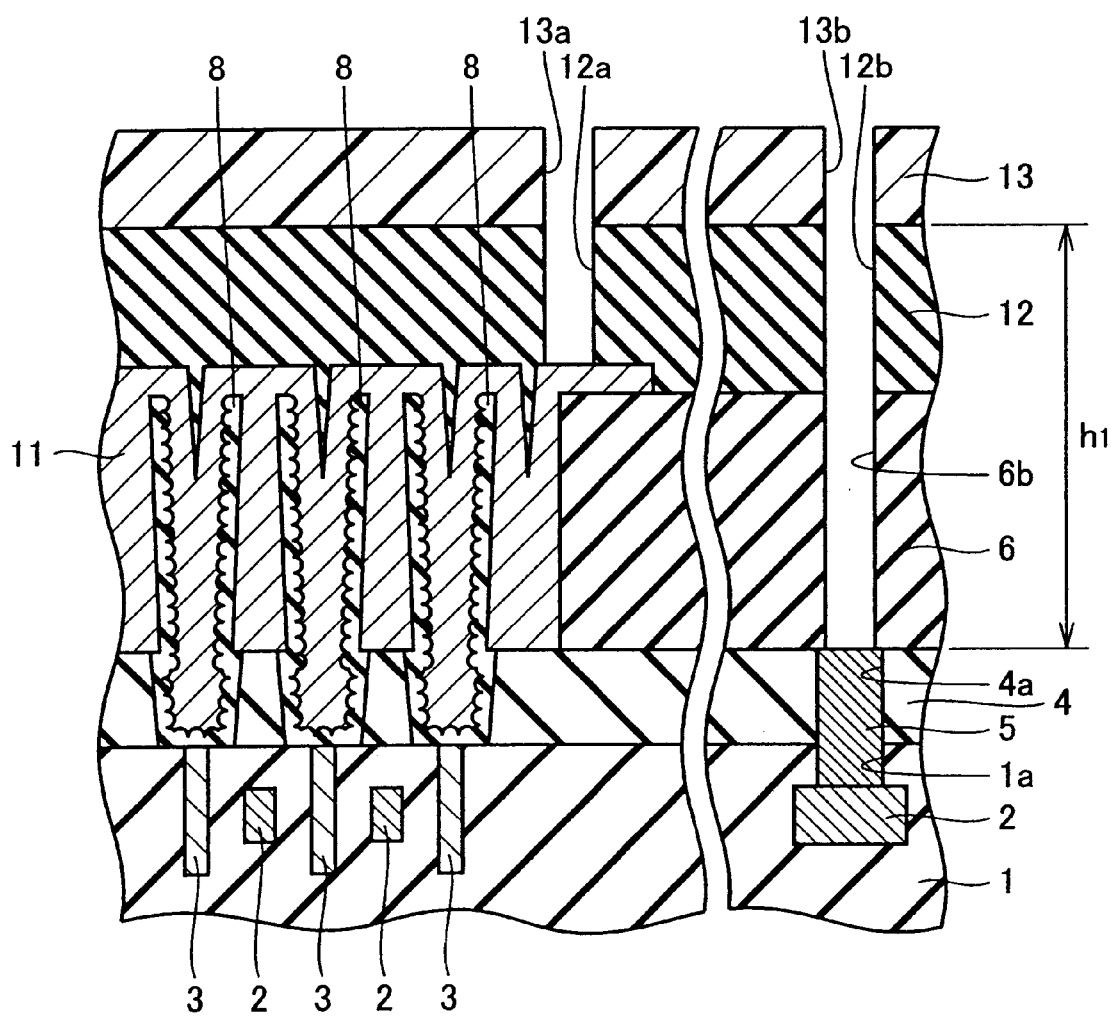

Next, in reference to FIG. 9, Ta 205 is deposited (not shown), as a dielectric film, to a film thickness of approximately 7 nm to 8 nm through a CVD method after the removal of resist film 10. After that, TiN/Ti is deposited, as cell plate 11, to a film thickness of approximately 90 nm to 100 nm through a CVD method and, then, is patterned to a predetermined form.

After that, third interlayer insulating film 12 made of a TEOS oxide film is formed to a film thickness of approximately 300 nm to 400 nm so as to cover the surfaces of cell plate 11 and of exposed second interlayer insulating film 6.

After that, a resist film 13 having openings 13a and 13b above cell plate 11 and first contact plug 5 is formed on third interlayer insulating film 12 and by using this resist film 13 as a mask contact holes 12a, 6b and 12b which reach to cell plate 11 and first contact plug 5 are formed on second interlayer insulating film 6 and in third interlayer insulating film 12. At this time, first contact plug 5 has already been provided in the opening of the contact hole that reaches to first contact plug 5 and, therefore, the length (h1) of the contact hole to be opened becomes short in comparison with the prior art so that the improvement of the aspect ratio is achieved. The width ($\phi$H1) of the opening of contact hole 6b, 12b is approximately 0.2 $\mu$m.

After that, resist film 13 is removed and TiN/Ti is deposited to a film thickness of approximately 20 nm to 25 nm through a CVD method within contact holes 12a, 6b and 12b, respectively and in addition, tungsten of which the film thickness is approximately 300 nm to 400 nm is deposited through a CVD method and, then, a flattening process is carried out on the surface by means of a CMP method so as to form contact plugs 14 and 15 shown in FIG. 1. After that, an aluminum wire layer 16 that is electrically connected to contact plugs 14 and 15 is formed on third interlayer insulating film 12.

(Working Effect)

As described above, in accordance with a semiconductor device and a manufacturing method for the same according to the present embodiment, it becomes possible to allow contact hole 4b, created in storage node interlayer insulating film 4 positioned in a lower layer, to have a large inner diameter by utilizing the wet etching ratio with respect to the wet etchant. As a result, the difficulty in contact hole creation due to a large aspect ratio of dry etching at the time of contact hole creation according to the prior art can be avoided.

In addition, it becomes possible to increase the capacitance of the capacitor formed of storage node 8, the dielectric film and cell plate 11 in this region of contact hole 4b and it becomes possible to increase the refreshing characteristics of a DRAM to which this capacitor is applied.

Furthermore, since the wet etching ratios of storage node interlayer insulating film 4 and of second interlayer insulating film 6 are positively made different with respect to the wet etchant, the step of easily removing solely second interlayer insulating film 6 is can be adopted so as to make easy the formation of a cylinder-type capacitor utilizing an outer peripheral surface region of a portion in a cylindrical form of storage node 8.

In addition, though conventionally in the case that the entirety of the cylindrical portion of storage node 8 is exposed, there is a risk that storage node 8 may fall down due to lack of strength, it becomes possible to avoid the falling down of storage node 8 because storage node interlayer insulating film 4 can be easily made to remain up to the middle of the cylinder.

In addition, a step is adopted wherein contact plug 5 is formed before the formation of second interlayer insulating film 6 and contact plug 15 is formed after the formation of second interlayer insulating film 6 in the peripheral region and, therefore, it becomes possible to make the formation of contact plug 5 and the formation of contact plug 15 be formations of a low aspect ratio.

(Second Embodiment)

Next, in reference to FIGS. 10 to 13, a structure of and a manufacturing method for a semiconductor device according to the present embodiment will be described.

(Structure of Semiconductor Device)

Figure 10:
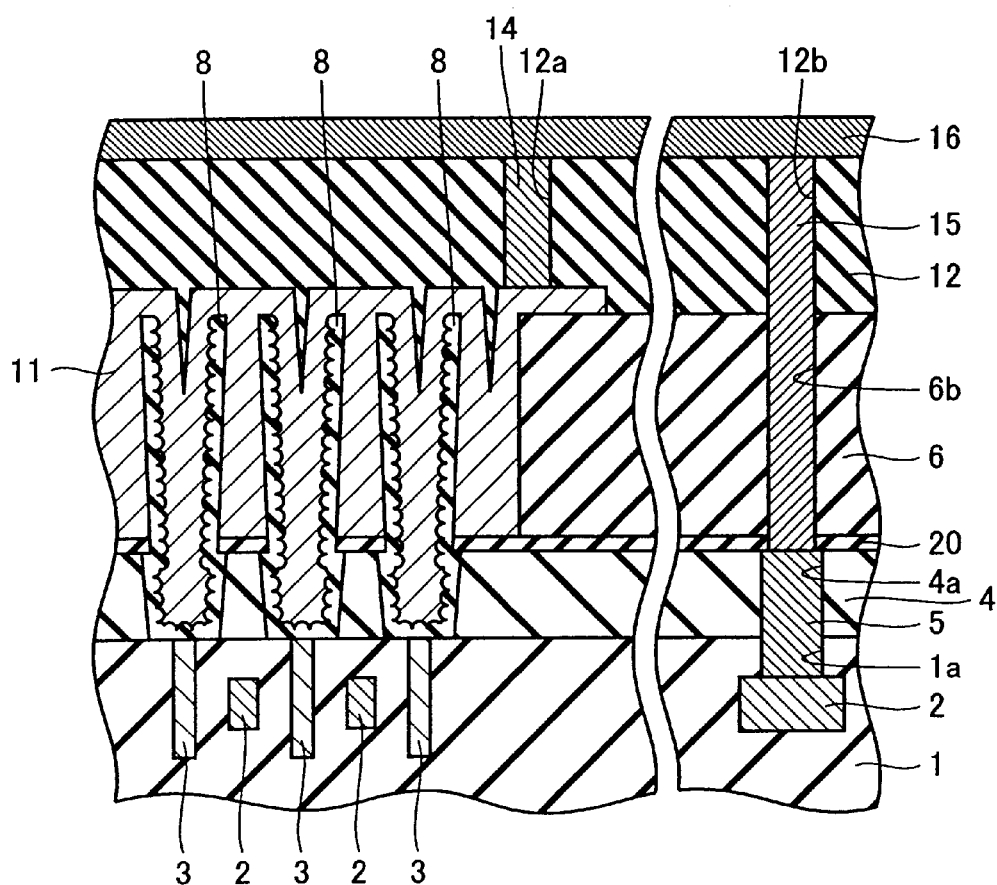
FIG. 10 is a cross sectional view showing the structure of a semiconductor device according to the second embodiment of the present invention.

First, in reference to FIG. 10, the structure of the semiconductor device according to the present embodiment is described. The basic structure of the semiconductor device is the same as of the semiconductor device described in the first embodiment and, therefore, the same reference numbers are attached to the same parts, of which the descriptions in detail are omitted.

The difference in structure, from the semiconductor device described in the first embodiment, is in the point wherein a nitride film 20 is provided, as an etching stopper film, between storage node interlayer insulating film 4 and cell plate 11 as well as between storage node interlayer insulating film 4 and second interlayer insulating film 6.

(Manufacturing Method for Semiconductor Device)

Next, a manufacturing method for a semiconductor device having the above described structure will be described in reference to FIGS. 11 and 12..

Figure 11:
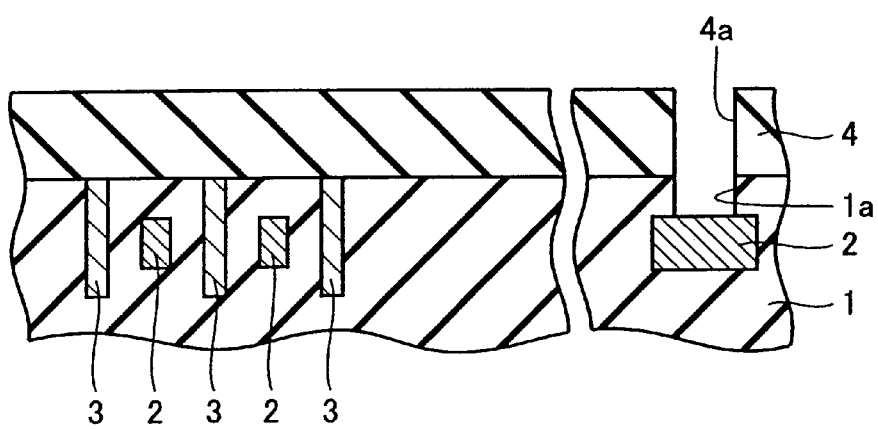
FIGS. 11 and 12 are cross sectional views of the first and second steps showing a manufacturing method for the 'semiconductor device according to the second embodiment of the present invention.

First, in reference to FIG. 11, bit line 2 and storage node contact 3 are embedded into predetermined positions of the memory cell region in the same manner as in the case of the first embodiment and a BPTEOS film of which the film thickness is approximately 500 nm to 700 nm is made to grow, as storage node interlayer insulating film 4, on the surface of interlayer insulating film 1 wherein bit line 2 is embedded into a predetermined position of the peripheral region. After that, opening 4a for the formation of the second contact hole is provided on bit line 2 in storage node interlayer insulating film 4 by using a photomechanical technology. The width ($\phi$H2) of the opening is approximately 0.3 $\mu$m to 0.4 $\mu$m.

Figure 12:
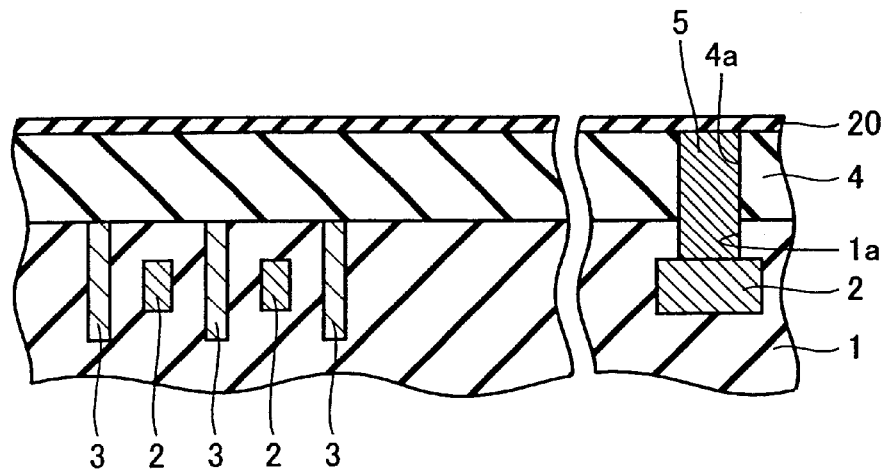
Figure 13:
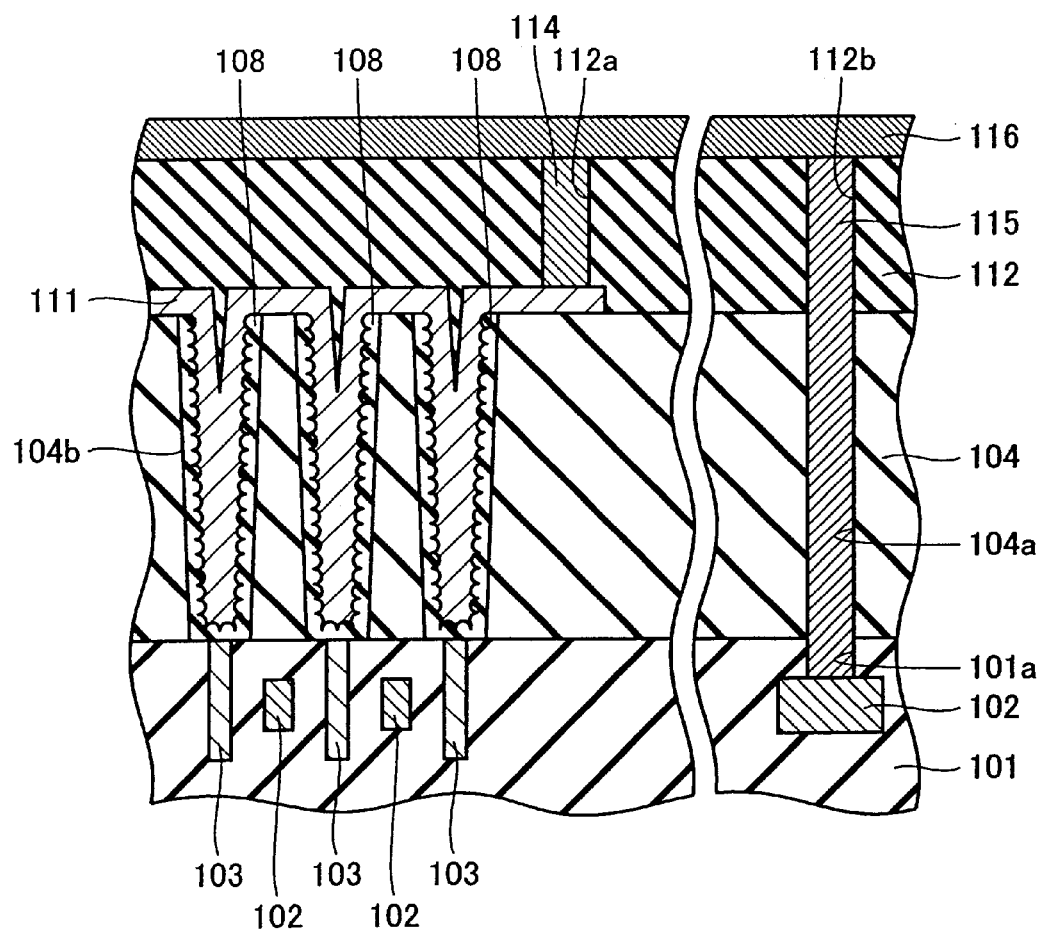
FIG. 13 is a cross sectional view showing the structure of a semiconductor device according to a prior art.

Next, in reference to FIG. 12, after TiN/Ti is deposited within opening 4a, tungsten (W) is deposited through a CVD method and then, the surface is flattened by means of a CMP process so as to form first contact plug 5. After that, nitride film 20 of which the film thickness is approximately 50 nm to 70 nm is made to grow, as an etching stopper film on the surface of storage node interlayer insulating film 4.

As for the manufacturing steps thereafter, the same steps as in the case of the first embodiment shown in FIGS. 4 to 9 are adopted and, thereby, the semiconductor device of the present embodiment shown in FIG. 10 is completed.

(Working Effect)

As described above, in accordance with the semiconductor device and the manufacturing method for the same according to the present embodiment, the same working effects as in the case of the first embodiment can be obtained. Furthermore, in the present embodiment, nitride film 20 is made to grow on the surface of storage node interlayer insulating film 4 in the memory cell region and, thereby, nitride film 20 works as an etching stopper at the time of the removal of second interlayer insulating film 6 shown in FIG. 8 so that the sole removal of second interlayer insulating film 6 becomes possible more easily than in the case of the embodiment.

In addition, in the peripheral region also, nitride film 20 works as an etching stopper at the time of the creation of a contact hole for first contact plug 5 so that it becomes possible to easily control etching.

In accordance with a manufacturing method for a semiconductor device of the present invention and a semiconductor device manufactured through this method, it becomes possible to allow a first contact hole created in the first interlayer insulating film positioned in a lower layer to have a large inner diameter by utilizing the wet etching ratio with respect to the wet etchant. As a result, it becomes possible to avoid the difficulty in contact hole creation due to a large aspect ratio in dry etching at the time of contact hole creation according to the prior art.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method for a semiconductor device having a memory cell region and a peripheral region, wherein said memory cell region includes a lower electrode electrically connected to a predetermined first connection region and an upper electrode provided to said lower electrode with a dielectric film interposed, comprising the steps of:

forming a first interlayer insulating film on said first connection region;

forming a second interlayer insulating film, of which a wet etching ratio with respect to a predetermined wet etchant is greater than that of said first interlayer insulating film, on said first interlayer insulating film;

forming a first contact hole which penetrates said first interlayer insulating film and said second interlayer insulating film to reach up to said first connection region in said memory cell region, and which is provided in a connection region between said first interlayer insulating film and said second interlayer insulating film such that an inner diameter of said first interlayer insulating film becomes greater than that of said second interlayer insulating film;

forming the lower electrode in a cylindrical form along an inner surface of said first contact hole;

removing only said second interlayer insulating film in said memory cell region; and interposing the dielectric film with respect to said lower electrode to embed the dielectric film into an inner peripheral surface of said lower electrode, and forming the upper electrode so as to surround an outer peripheral surface of said lower electrode.

2. The manufacturing method for the semiconductor device according to claim 1, further comprising the steps of:

forming a third interlayer insulating film which covers said upper electrode and said second interlayer insulating film;

forming a second connection region in advance in a position lower than said first interlayer insulating film in said peripheral region;

forming a contact hole which reaches up to said second connection region after the formation of said first interlayer insulating film, and forming a first contact plug within this contact hole; and creating a contact hole which reaches up to said first contact plug and which penetrates said second interlayer insulating film and said third interlayer insulating film after the formation of said third interlayer insulating film, and forming a second contact plug within this contact hole.

3. The manufacturing method for a semiconductor device according to claim 1, further comprising a step of forming an etching stopper film between said first interlayer insulating film and said second interlayer insulating film.

* * * * *